United States Patent
Ichikawa et al.

(10) Patent No.: US 11,211,727 B2
(45) Date of Patent: Dec. 28, 2021

(54) CONNECTOR-ATTACHED CIRCUIT BODY AND BUS BAR MODULE

(71) Applicant: YAZAKI CORPORATION, Tokyo (JP)

(72) Inventors: Yoshiaki Ichikawa, Shizuoka (JP); Kimitoshi Makino, Shizuoka (JP); Makoto Kobayashi, Shizuoka (JP); Tomoji Yasuda, Shizuoka (JP)

(73) Assignee: YAZAKI CORPORATION, Tokyo (JP)

(*) Notice: Subject to any disclaimer, the term of this patent is extended or adjusted under 35 U.S.C. 154(b) by 0 days.

(21) Appl. No.: 16/525,462

(22) Filed: Jul. 29, 2019

(65) Prior Publication Data

US 2020/0044376 A1  Feb. 6, 2020

(30) Foreign Application Priority Data

Jul. 31, 2018 (JP) .............................. JP2018-143714

(51) Int. Cl.
| | |
|---|---|
| *H01R 3/00* | (2006.01) |
| *H01R 12/79* | (2011.01) |
| *H01R 25/16* | (2006.01) |
| *H05K 1/18* | (2006.01) |
| *H01R 12/58* | (2011.01) |
| *H01R 13/66* | (2006.01) |
| *H01R 12/53* | (2011.01) |
| *H05K 3/32* | (2006.01) |

(52) U.S. Cl.
CPC ............. *H01R 12/79* (2013.01); *H01R 12/53* (2013.01); *H01R 12/58* (2013.01); *H01R 13/66* (2013.01); *H01R 25/164* (2013.01); *H05K 1/18* (2013.01); *H05K 3/32* (2013.01); *H05K 2201/10272* (2013.01)

(58) Field of Classification Search
CPC .. H01R 12/58; H01R 12/7023; H01R 12/778; H01R 12/79; H01R 13/506; H01R 13/582
USPC .......................................................... 439/500
See application file for complete search history.

(56) References Cited

U.S. PATENT DOCUMENTS

| | | | | |
|---|---|---|---|---|
| 5,252,091 A | * | 10/1993 | Fujita ..................... | H01R 25/14 |
| | | | | 439/499 |
| 8,506,322 B2 | * | 8/2013 | Spare .................... | H01M 50/20 |
| | | | | 439/500 |
| 8,574,003 B2 | * | 11/2013 | Ikeda ................... | H01M 50/502 |
| | | | | 439/500 |
| 8,652,678 B2 | * | 2/2014 | Musetti ............ | H01M 10/6563 |
| | | | | 429/158 |
| 8,764,479 B2 | * | 7/2014 | Chang ................ | H01R 13/6608 |
| | | | | 439/500 |

(Continued)

FOREIGN PATENT DOCUMENTS

| | | |
|---|---|---|
| CN | 202333161 U | 7/2012 |
| JP | 2002-93995 A | 3/2002 |
| JP | 2013-175303 A | 9/2013 |

*Primary Examiner* — Abdullah A Riyami
*Assistant Examiner* — Thang H Nguyen
(74) *Attorney, Agent, or Firm* — Kenealy Vaidya LLP

(57) ABSTRACT

A connector-attached circuit body include a circuit body including a flexible substrate having a wiring pattern, and a connector attached to the circuit body and including a terminal and a housing that accommodates the terminal. The terminal is electrically connected to the wiring pattern and extends in a thickness direction of the circuit body.

3 Claims, 4 Drawing Sheets

(56) References Cited

U.S. PATENT DOCUMENTS

| | | | | |
|---|---|---|---|---|
| 8,930,738 B1* | 1/2015 | King, Jr | .................... | G06F 1/30 |
| | | | | 713/340 |
| 9,039,454 B2* | 5/2015 | Ogasawara | .......... | H01R 11/281 |
| | | | | 439/627 |
| 10,468,654 B2* | 11/2019 | Dulle | ...................... | B60L 50/51 |
| 2002/0045382 A1* | 4/2002 | Takahashi | ............ | H01R 13/582 |
| | | | | 439/499 |
| 2004/0092157 A1* | 5/2004 | Sawayanagi | ......... | H01R 4/2433 |
| | | | | 439/495 |
| 2010/0173509 A1* | 7/2010 | Holbrook | ............. | H05K 7/1432 |
| | | | | 439/208 |
| 2010/0178813 A1* | 7/2010 | Holbrook | ............. | H05K 7/1432 |
| | | | | 439/775 |
| 2014/0308560 A1 | 10/2014 | Takishita et al. | | |
| 2015/0072209 A1* | 3/2015 | Tyler | ....................... | B60L 1/003 |
| | | | | 429/121 |
| 2017/0005381 A1* | 1/2017 | Harris | .................. | H01M 50/116 |
| 2018/0090735 A1* | 3/2018 | Huff | ....................... | H05K 1/118 |
| 2019/0082536 A1* | 3/2019 | Park | .................... | H04M 1/0262 |
| 2019/0148874 A1* | 5/2019 | Sorrentino | ............. | H01R 13/73 |
| | | | | 439/136 |
| 2020/0358146 A1* | 11/2020 | Ahn | .................... | H01M 10/443 |

* cited by examiner

CONNECTOR-ATTACHED CIRCUIT BODY AND BUS BAR MODULE

CROSS REFERENCE TO RELATED APPLICATIONS

This application claims priority from Japanese Patent Application No. 2018-143714 filed on Jul. 31, 2018, the entire contents of which are incorporated herein by reference.

BACKGROUND OF THE INVENTION

Field of the Invention

The present invention relates to a connector-attached circuit body and a bus bar module.

Description of Related Art

In related art, flexible substrates (Flexible Printed Circuits, FPC) provided with wiring patterns are used as wirings for connecting various electronic devices (for example, see Patent Literature 1). The flexible substrate is characterized by generally including a structure in which a thin film conductor layer that constitutes a wiring pattern (that is, a circuit) having a predetermined shape is sandwiched by insulating films, and particularly enabling flexible deformation such as curvature while maintaining electrical characteristics.

[Patent Literature 1] JP-A-2002-093995

When a connector is attached to a long flexible substrate, a connector that includes terminal accommodation chambers and terminals extending in a longitudinal direction of the flexible substrate is usually attached to a terminal portion of the flexible substrate. However, for example, when electronic devices that are to be electrically connected by the flexible substrate are arranged close to each other and the connector is fitted to a mating connector, the flexible substrate may be greatly curved (that is, a curvature radius decreases) at a proximal end portion of the connector (a portion where the flexible substrate is connected). Such a large curvature can cause a load on contact between the flexible substrate and the connector. Therefore, for example, measures such as increasing the length of the flexible substrate or arranging the electronic devices apart from each other are taken. However, such measures may interfere with space saving, height reduction and the like due to close arrangement of the electronic devices.

SUMMARY

One or more embodiments provide provide a connector-attached circuit body and a bus bar module capable of saving space and reducing the height of the entire system including connection objects by close arrangement of the connection objects electrically connected to each other.

In an aspect (1), a connector-attached circuit body include a circuit body including a flexible substrate having a wiring pattern, and a connector attached to the circuit body and including a terminal and a housing that accommodates the terminal. The terminal is electrically connected to the wiring pattern and extends in a thickness direction of the circuit body.

In an aspect (2), the housing includes an opening corresponding to a mating connector in which the connector is configured to be fitted, and the connector further includes a cover that is assembled to the housing and has an inclined surface on an outer surface of the cover such that the outer surface extends outward toward the opening in the thickness direction of the circuit body.

In an aspect (3), a bus bar module attached to a battery assembly in which a plurality of single cells are stacked, includes a circuit body including a flexible substrate having a wiring pattern, a connector attached to the circuit body, a bus bar configured to be connected to electrodes of the plurality of single cells and a holder holding the bus bar and being stretchable in a stacking direction of the plurality of single cells. The circuit body is configured to connect the bus bar and the connector by the wiring pattern. The connector includes a terminal that is electrically connected to the wiring pattern and extends in a thickness direction of the circuit body, and a housing that accommodates the terminal.

According to the aspect (1), the terminal is connected to the wiring pattern so as to extend in the thickness direction of the circuit body (for example, orthogonal to the circuit body), and a housing is provided so as to accommodate the terminal. Accordingly, when the connector is fitted to a mating connector, curvature degree of the circuit body can be reduced by the connector itself merely being inclined with respect to the circuit body (that is, by the connector itself merely extending in the thickness direction of the circuit body). As a result, for example, even if connection objects are arranged close to each other, the curvature degree of the circuit body can be reduced while shortening the length of the circuit body as compared with the above-described connector-attached circuit body in related art. Therefore, if the connector-attached circuit body of the present configuration is used, the connection objects can be arranged closer to each other than a case where the connector-attached circuit body in related art is used. In this way, the connector-attached circuit body of the configuration enables space saving and height reduction of the entire system including the connection objects.

According to the aspect (2), the outer surface of the cover is provided with the inclined surface that spreads toward the opening of the housing (that is, toward an engagement position with the mating connector). Therefore, for example, even if water droplets or the like approach the housing from a cover side, the water droplets or the like are guided away from the opening of the housing, so that an electrical connection position between the connector and the mating connector can be prevented from getting wet. Therefore, reliability of electrical connection between the connector-attached circuit body and the mating connector can be improved.

According to the aspect (3), the terminal is connected to the wiring pattern so as to extend in the thickness direction of the circuit body (for example, orthogonal to the circuit body), and the housing is provided so as to accommodate the terminal. Accordingly, when the connector is fitted to a mating connector, curvature degree of the circuit body can be reduced by the connector itself merely being inclined with respect to the circuit body (that is, by the connector itself merely extending in the thickness direction of the circuit body). As a result, for example, even if the bus bar module and a peripheral device (for example, an electric control box) are arranged close to each other, the curvature degree of the circuit body can be reduced while shortening the length of the circuit body as compared with the above-described connector-attached circuit body in related art. Therefore, the bus bar module of the present configuration is used to enable space saving and height reduction of the entire system including the bus bar module and the peripheral device by close arrangement of the bus bar module and the peripheral device.

According to one or more embodiments, space can be saved when the connection objects electrically connected to each other are arranged close to each other in the connector-attached circuit body and the bus bar module.

The invention has been briefly described as above. Details of the invention are further clarified by reading a mode for carrying out the invention described below with reference to the accompanying drawings.

DETAILED DESCRIPTION

Embodiment

Figure 1:
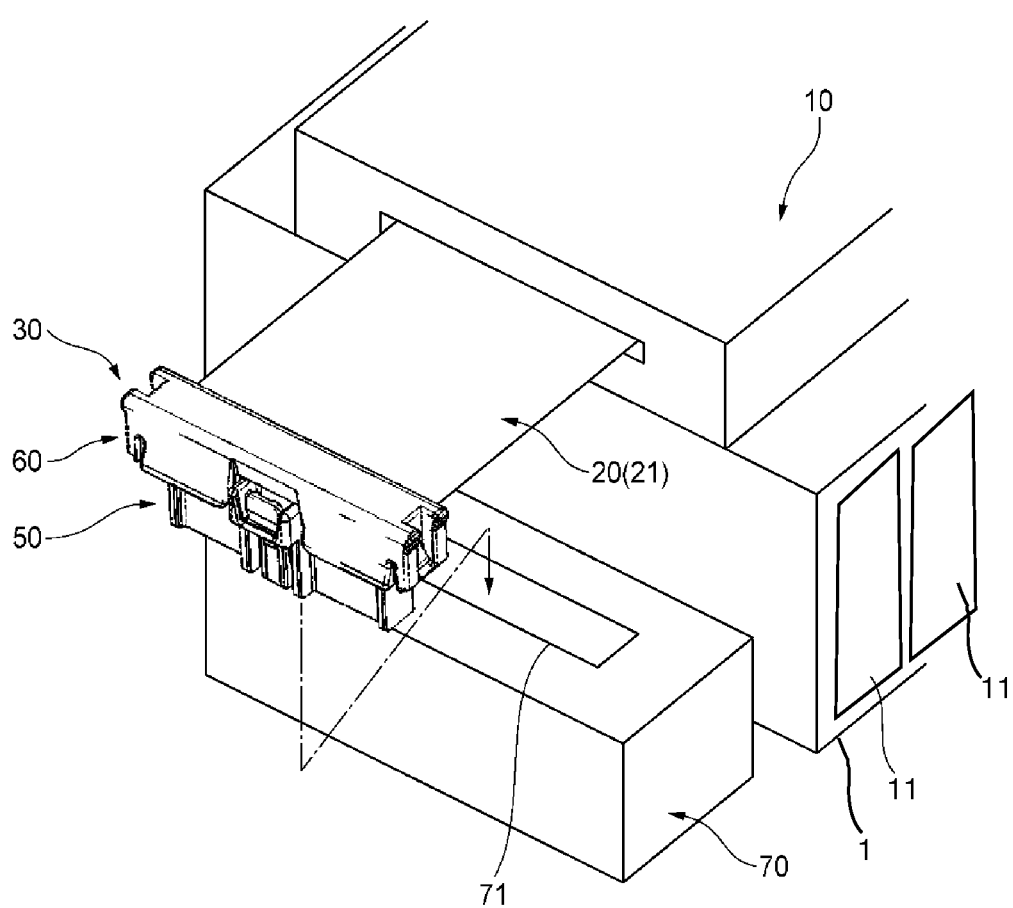
FIG. 1 is a perspective view schematically showing a state in which a battery assembly and an electric control box assembled to a side surface of the battery assembly are electrically connected by a bus bar module, according to the present embodiment, assembled to an upper surface of the battery assembly.
Figure 1:
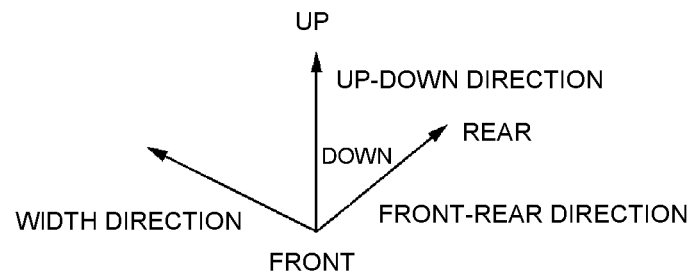

Hereinafter, a bus bar module 10 including a connector-attached circuit body according to an embodiment of the invention will be described with reference to the drawings. As shown in FIG. 1, the bus bar module 10 according to the embodiment is, for example, used to be assembled to a battery assembly 1 (a battery module in which a plurality of single cells 11 are stacked) as a driving power source mounted on an electric automobile, a hybrid automobile or the like. Hereinafter, as shown in FIG. 1, an up-down direction, a front-rear direction and a width direction, as well as up, down, front and rear are defined for easy description. The up-down direction, the front-rear direction and the width direction are orthogonal to each other.

(Structure of Battery Assembly)

First, the battery assembly 1 to which the bus bar module 10 according to the embodiment is attached will be described. The battery assembly 1 is formed by connecting a plurality of single cells 11 (as shown schematically in FIG. 1) in series. Each of the plurality of single cells 11 is provided with a positive electrode and a negative electrode protruding from an upper portion of a battery main body (a main body) having a rectangular parallelepiped shape. The positive electrode and the negative electrode are arranged apart from each other on an electrode surface of the battery main body, and are provided to respectively protrude in a cylindrical shape substantially vertically upward from the electrode surface.

The battery assembly 1 is arranged to stack the single cells 11 in the front-rear direction (a stacking direction) such that positive electrodes and negative electrodes of adjacent single cells 11 alternate. In the battery assembly 1, for example, among the single cells 11 corresponding to both end portions of the single cells 11 connected in series, a positive electrode of one single cell is a total positive electrode and a negative electrode of the other single cell is a total negative electrode. In an example shown in FIG. 1, an electric control box 70 (for example, an ECU) that performs voltage detection and diagnosis on the battery assembly 1 is assembled to a side surface of the battery assembly 1.

(Structure of Bus Bar Module)

Next, the bus bar module 10 of the embodiment will be described. As shown in FIG. 1, the bus bar module 10 includes a circuit body 20 that is formed of a flexible substrate (FPC) and is connected to a bus bar (not shown) connected to positive electrodes and negative electrodes of the single cells 11, and a holder (not shown) that accommodates and holds the circuit body 20 and attaches the circuit body 20 to an upper surface of the battery assembly 1. The holder holds the bus bar and is stretchable in the stacking direction (the front-rear direction) of the plurality of single cells 11. In this way, the bus bar module 10 is assembled to the upper surface of the battery assembly 1.

As shown in FIG. 1, the circuit body 20 is arranged on the battery assembly 1 (the single cells 11) in the stacking direction (the front-rear direction), and includes a strip-shaped extension portion 21 provided with a plurality of wiring patterns (not shown). A portion of the extension portion 21 having a predetermined length from a front end portion thereof is exposed from the holder without being accommodated in the holder, and extends forward from a side surface of the battery assembly 1 to which the electric control box 70 is assembled. A connector 30 is attached to the front end portion of the extension portion 21. The connector 30 can be fitted to a connector portion 71 of the electric control box 70 (see FIG. 1).

Figure 2:
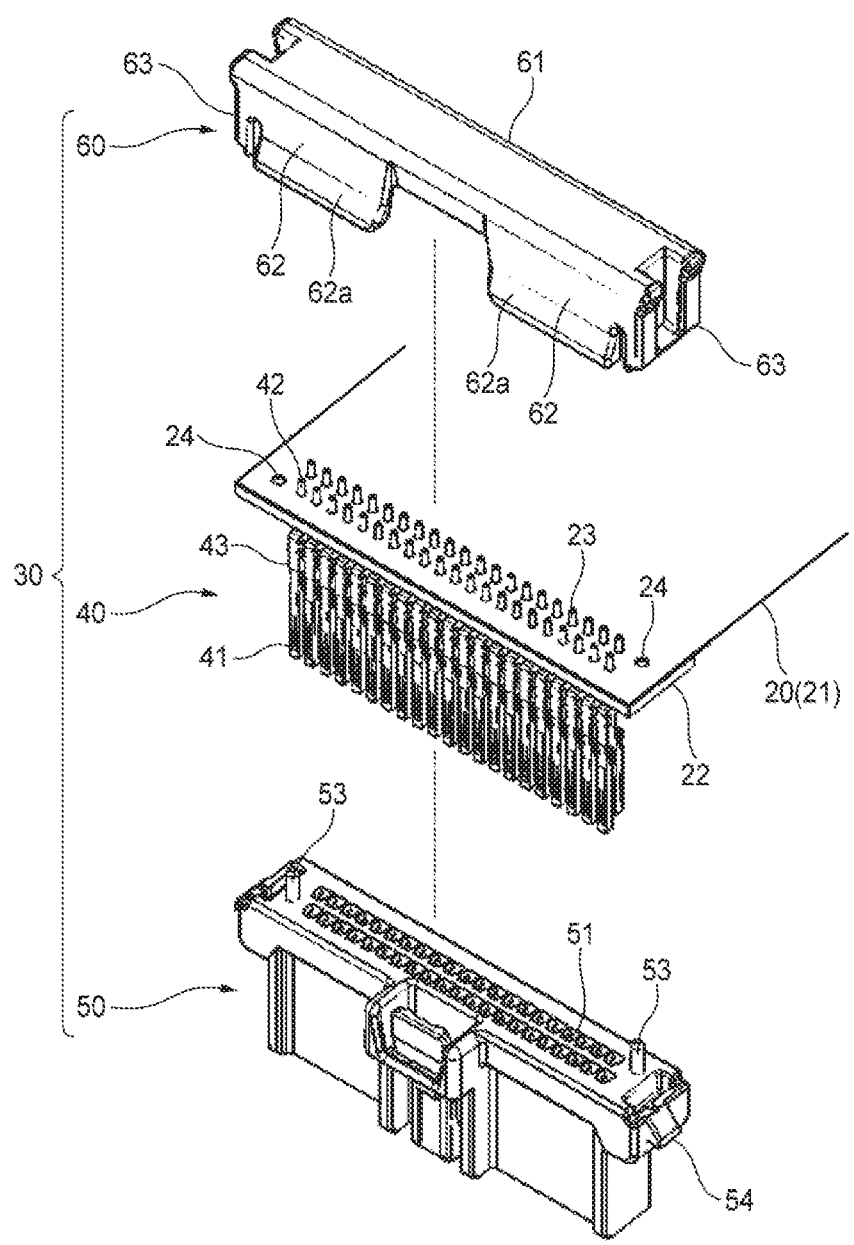
FIG. 2 is an exploded perspective view of the bus bar module according to the embodiment.

As shown in FIG. 2, the connector 30 includes a plurality of terminals 40, a housing 50 that accommodates the terminals 40, and a cover 60 assembled to the housing 50.

Figure 3:
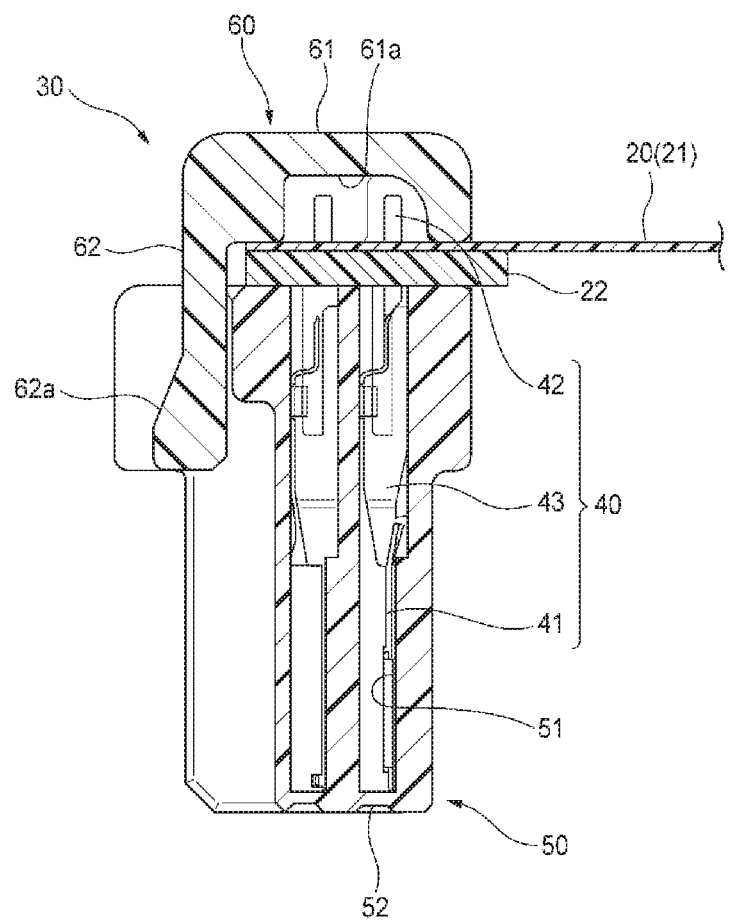
FIG. 3 is a main longitudinal sectional view of the bus bar module according to the embodiment.

As shown in FIGS. 2 and 3, each metal terminal 40 integrally includes a distal end side connection portion 41 located on a lower end side (a distal end side), a proximal end side connection portion 42 located on an upper end side (a proximal end side), and a connection portion 43 that connects the distal end side connection portion 41 and the proximal end side connection portion 42. The distal end side connection portion 41 has a tubular shape and functions to connect with a mating terminal (a male terminal, not shown) arranged in the connector portion 71 of the electric control box 70.

The proximal end side connection portion 42 has a rod-like shape and functions to connect with a wiring pattern (not shown) at the front end portion of the extension portion 21 of the circuit body 20. A reinforcement plate 22 is provided on a lower surface of the front end portion of the extension portion 21 of the circuit body 20. A plurality of through holes 23 that penetrate the reinforcement plate 22 and the circuit body 20 in the up-down direction (a thickness direction of the circuit body 20) are formed in the front end portion of the extension portion 21 in correspondence with arrangement of the plurality of terminals 40. The proximal end side connection portions 42 of the plurality of terminals 40 are inserted into the through holes 23 and fixed by soldering or the like. Accordingly, the terminals 40 are fixed to the front end portion of the extension portion 21 so as to protrude downward (in the thickness direction of the circuit body 20) from the front end portion of the extension portion 21, and are connected to the wiring patterns (not shown) in the circuit body 20.

As shown in FIG. 2, the resin housing 50 generally has a rectangular parallelepiped shape extending in the up-down direction (a fitting direction of the connector 30). As shown in FIG. 3, a plurality of terminal accommodation chambers 51 that accommodate the plurality of terminals 40 are formed inside the housing 50 so as to penetrate in the up-down direction in correspondence with the arrangement of the plurality of terminals 40. An opening 52 at a lower end of each terminal accommodation 51 functions as an insertion hole into which the mating terminal is inserted.

The plurality of terminals 40 fixed to the front end portion of the circuit body 20 (the extension portion 21) are respectively inserted and accommodated into the plurality of terminal accommodation chambers 51 of the housing 50 from the upper end side (the proximal end side). As shown in FIG. 3, when accommodation of the terminals 40 into the terminal accommodation chambers 51 is completed, the reinforcement plate 22 is in contact with an upper end surface (a proximal end surface) of the housing 50. Positioning of the extension portion 21 of the circuit body 20 and the housing 50 is achieved by inserting a pair of positioning protrusions 53 (see FIG. 2) formed on the upper end surface of the housing 50 into a pair of positioning holes (through holes) 24 (see FIG. 2) formed at the front end portion of the extension portion 21. As shown in FIG. 3, the housing 50 that accommodate the plurality of terminals 40 is fixed to the front end portion of the extension portion 21 so as to protrude downward (in the thickness direction of the circuit body 20) from the front end portion of the extension portion 21.

The resin cover 60 mainly covers the front end portion of the extension portion 21 of the circuit body 20, thereby functioning to protect the proximal end side connection portions 42 (see FIG. 2) of the plurality of terminals 40 slightly protruding upward from an upper surface of the front end portion of the extension portion 21. As shown in FIG. 2, the cover 60 includes a flat plate-like upper wall portion 61, a pair of side wall portions 62 hanging from both widthwise side portions of a front end edge of the upper wall portion 61, and a pair of engagement portions 63 provided at both widthwise end portions of the upper wall portion 61.

The cover 60 is assembled from above with respect to the housing 50 that accommodates the plurality of terminals 40. The cover 60 and the housing 50 are fixed to each other by engaging a pair of engagement portions 63 on a cover 60 side with a pair of engagement portions 54 provided at both widthwise end portions of the housing 50 (also see FIG. 4).

As shown in FIG. 3, when the cover 60 is assembled to the housing 50, a lower surface of the upper wall portion 61 of the cover 60 is in contact with the upper surface of the front end portion of the extension portion 21 of the circuit body 20. The proximal end side connection portions 42 of the plurality of terminals 40 slightly protruding from the upper surface of the front end portion of the extension portion 21 are located in a recessed portion 61a provided on the lower surface of the upper wall portion 61 (recessed upward).

Figure 4:
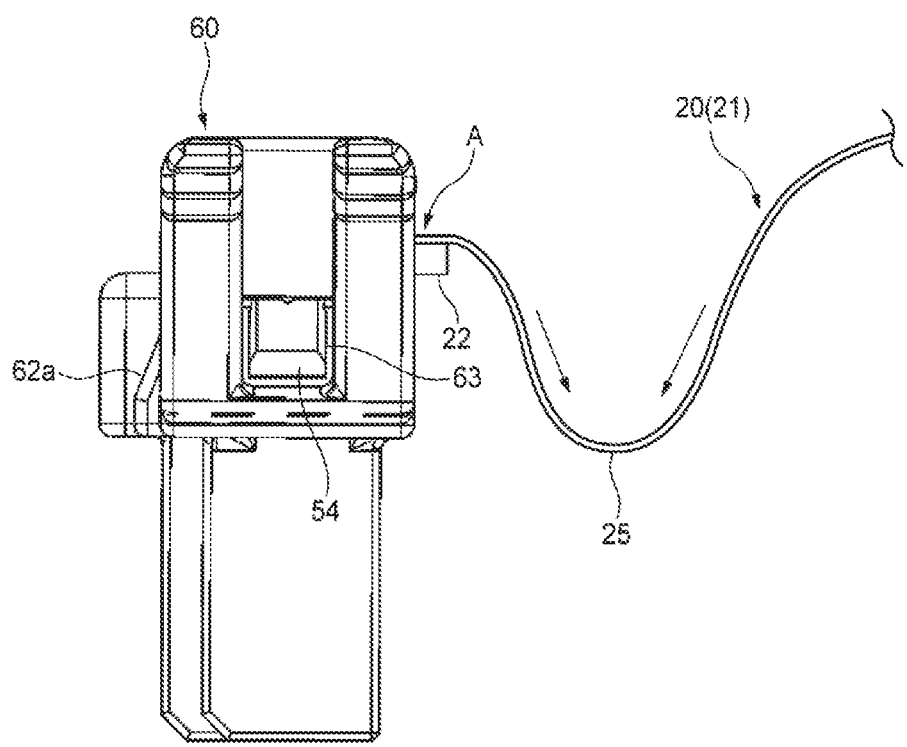
FIG. 4 is a view illustrating a state in which water droplets or the like are prevented from entering a connector by bending a part of the circuit body extending from the connector in a longitudinal direction so as to protrude downward.

As shown in FIGS. 2 and 3, an inclined surface 62a is formed at a lower end portion of the side wall portion 62 of the cover 60 such that an outer surface of the cover 60 spreads outward (forward) and downward (also see FIG. 4). As a result, water droplets or the like approaching the connector 30 from the cover 60 side are less likely to approach the opening 52 of the housing.

From the viewpoint of preventing water droplets or the like from approaching the opening 52 of the housing 50, as shown in FIG. 4, when the battery assembly 1 and the electric control box 70 are electrically connected by the circuit body 20, apart of the circuit body 20 extending from the connector 30 in a longitudinal direction may be bent so as to protrude downward from a connection position A between the connector 30 and the circuit body 20. Accordingly, water droplets or the like adhering to an upper surface of the circuit body 20 move toward a lower end portion of the bent portion of the circuit body 20 as shown by arrows in FIG. 4, and the water droplets or the like can be more reliably prevented from entering the connector 30 by being drained to flow out from side portions of the circuit body 20.

As described above, according to the bus bar module 10 including the connector-attached circuit body according to the embodiment, the terminals 40 are connected to the wiring patterns so as to extend in the thickness direction of the circuit body 20 (orthogonal to the circuit body 20), and the housing 50 is provided to accommodate the terminals 40, thereby forming the connector 30. Accordingly, for example, as shown in FIG. 1, even when the battery assembly 1 and the electric control box 70 are arranged close to each other and the length of the circuit body 20 that connects the battery assembly 1 and the electric control box 70 is shortened, the battery assembly 1 and the electric control box 70 can be easily connected without curving the circuit body 20. Therefore, by close arrangement of the battery assembly 1 and the electric control box 70 electrically connected to each other, space saving and height reduction of the entire system including the bus bar module 10, the electric control box 70 and the like are possible.

In the bus bar module 10 according to the embodiment, since the outer surface of the cover 60 is provided with the inclined surface 62a that spreads toward the opening 52 of the housing 50 (that is, toward a fitting position with the connector portion 71 of the electric control box 70), water droplets or the like are less likely to approach the opening 52 of the housing 50. Therefore, reliability of electrical connection of the bus bar module 10 can be improved.

The invention is not limited to the above embodiment, and various modifications can be adopted within the scope of the invention. For example, the invention is not limited to the above-described embodiment, and can be appropriately modified, improved or the like. In addition, the material, shape, size, number, arrangement position, and the like of each component in the above-described embodiment are optional and are not limited as long as the invention can be achieved.

Here, features of the connector-attached circuit body and the embodiment of the bus bar module 10 according to the invention will be briefly summarized and listed in the following [1] to [3].

[1] A connector-attached circuit body comprising:
a circuit body including a flexible substrate having a wiring pattern; and
a connector attached to the circuit body and including a terminal and a housing that accommodates the terminal,
wherein the terminal is electrically connected to the wiring pattern and extends in a thickness direction of the circuit body.

[2] The connector-attached circuit body according to [1],
wherein the housing includes an opening corresponding to a mating connector in which the connector is configured to be fitted, and
wherein the connector further includes a cover that is assembled to the housing and has an inclined surface (62a) on an outer surface of the cover such that the outer surface extends outward toward the opening in the thickness direction of the circuit body.

[3] A bus bar module attached to a battery assembly in which a plurality of single cells are stacked, comprising:
  a circuit body including a flexible substrate having a wiring pattern;
  a connector attached to the circuit body;
  a bus bar configured to be connected to electrodes of the plurality of single cells; and
  a holder holding the bus bar and being stretchable in a stacking direction of the plurality of single cells,
  wherein the circuit body is configured to connect the bus bar and the connector by the wiring pattern, and
  wherein the connector includes a terminal that is electrically connected to the wiring pattern and extends in a thickness direction of the circuit body, and a housing that accommodates the terminal.

DESCRIPTION OF REFERENCE NUMERALS AND SIGNS 1 battery assembly
10 bus bar module
20 circuit body
30 connector
40 terminal
50 housing
60 cover
62a inclined surface
71 connector portion (mating connector)

What is claimed is:

1. A bus bar module attached to a battery assembly in which a plurality of single cells are stacked, comprising:
  a circuit body having a cover side and a housing side opposing the cover side and including a flexible substrate; and
  a connector attached to the circuit body;
  wherein the circuit body is configured to connect the battery assembly and the connector,
  wherein the connector includes a terminal that is electrically connected to the circuit body and extends in a thickness direction of the circuit body, and a housing that accommodates the terminal,
  wherein the housing includes an opening configured to receive a mating connector in which the connector is configured to be fitted,
  wherein the connector further includes a cover that is assembled to the housing and has an upper wall portion that faces the cover side of the circuit body and a side wall portion that extends from the upper wall portion toward the opening beyond the housing side of the circuit body in the thickness direction of the circuit body, and
  an outer surface of the side wall portion has an inclined surface positioned closer to the opening than the circuit body in the thickness direction, the inclined surface extending outward toward the opening in the thickness direction of the circuit body.

2. The bus bar module according to claim 1,
wherein the circuit body is disposed between the upper wall portion and the inclined surface in the thickness direction, such that water droplets on the inclined surface are diverted away from the opening of the housing.

3. The bus bar module according to claim 1,
wherein the side wall portion faces an edge of the circuit body in an extending direction of the circuit body, and
wherein the inclined surface extends away from the circuit body in the extending direction of the circuit body as the inclined surface approaches the opening.

* * * * *